(12) United States Patent
Imamura et al.

(10) Patent No.: US 7,547,581 B2
(45) Date of Patent: Jun. 16, 2009

(54) MANUFACTURING METHOD OF A SEMICONDUCTOR DEVICE TO SUPPRESS GENERATION OF WHISKERS

(75) Inventors: Yumi Imamura, Tokyo (JP); Kenji Yamamoto, Tokyo (JP); Tomohiro Murakami, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 252 days.

(21) Appl. No.: 11/362,847

(22) Filed: Feb. 28, 2006

(65) Prior Publication Data

US 2007/0059916 A1    Mar. 15, 2007

(30) Foreign Application Priority Data

Sep. 15, 2005   (JP) .............................. 2005-268904

(51) Int. Cl.
    *H01L 21/00* (2006.01)
    *H01L 23/48* (2006.01)
    *H01R 43/00* (2006.01)

(52) U.S. Cl. .......................... 438/123; 438/611; 29/827; 257/772; 257/E23.031; 257/E23.053

(58) Field of Classification Search ........................ None
See application file for complete search history.

(56) References Cited

U.S. PATENT DOCUMENTS

| | | | | |
|---|---|---|---|---|
| 5,329,158 | A * | 7/1994 | Lin ............................. | 257/666 |
| 6,313,412 | B1 * | 11/2001 | Trumble et al. ............. | 174/260 |
| 6,478,944 | B1 * | 11/2002 | Ishiyama ..................... | 205/102 |
| 6,545,344 | B2 * | 4/2003 | Abbott ........................ | 257/666 |
| 6,891,253 | B2 * | 5/2005 | Miyaki et al. ............... | 257/666 |
| 6,960,823 | B2 * | 11/2005 | Miyaki et al. ............... | 257/676 |
| 2002/0053721 | A1 * | 5/2002 | Kubara et al. ............... | 257/666 |

FOREIGN PATENT DOCUMENTS

| | | | |
|---|---|---|---|
| JP | 01305551 A | * | 12/1989 |
| JP | 2002-69688 | | 3/2002 |
| JP | 2002-368175 | | 12/2002 |
| JP | 2004-200249 | | 7/2004 |

OTHER PUBLICATIONS

Selective Plating for Surface-Mounted Component Lead, Sep. 1986, IBM Techinical Disclosure Bulletin, vol. 29,pp. 1652-1653.*

* cited by examiner

*Primary Examiner*—Alonzo Chambliss
(74) *Attorney, Agent, or Firm*—Oblon, Spivak, McClelland, Maier & Neustadt, P.C.

(57) ABSTRACT

It is suppressed that a whisker occurs on a lead for external connection.

A lead for external connection is formed of the alloy (42Alloy) of Fe and Ni, and a plating film which includes alloy of Sn and Cu is formed on the surface. Next, using a heat-treat furnace, the heat treatment at the temperature beyond melting-point $T_0$ of the plating film is performed, and the plating film is melted. At this time, the temperature beyond $T_0$ is held for 20 seconds or more. The grain boundary of the plating film can be vanished by the above-mentioned heat treatment. Hereby, the internal stress of the plating film can be eased, and the generation of the whisker can be suppressed.

17 Claims, 7 Drawing Sheets

MANUFACTURING METHOD OF A SEMICONDUCTOR DEVICE TO SUPPRESS GENERATION OF WHISKERS

CROSS-REFERENCE TO RELATED APPLICATION

The present application claims priority from Japanese patent application No. 2005-268904 filed on Sep. 15, 2005, the content of which is hereby incorporated by reference into this application.

FIELD OF THE INVENTION

The present invention relates to a manufacturing method of a semiconductor device, and particularly relates to a manufacturing method of a semiconductor device which suppresses a generation of the whisker leading to a short circuit defect of a lead in formation of the lead for external connection of the semiconductor device.

DESCRIPTION OF THE BACKGROUND ART

In a manufacturing method of a semiconductor device of a resin molded type, in order to make it join to an external equipment good, a plating film is formed on a surface of the lead for external connection. A good solderability is obtained when the lead for external connection is connected with a mounting substrate etc. by forming this. As a material of a plating film, a Sn—Pb alloy which added Pb (lead) to Sn (tin) has been used widely. This alloy is excellent in wettability and can improve bond strength (for example, refer to Patent Reference 1).

However, since it is required from consideration of an environment in recent years that lead should not be used for an electronic equipment, the material which does not contain lead is used for the plating film. For this reason, a Sn—Bi alloy which added Bi (bismuth) to Sn has been used instead of Sn—Pb alloy.

When alloy, such as Sn—Bi, is used as a plating film, the metal whisker from a surface of the plating film occurs. When this grows and it becomes long, the trouble that the adjoining leads for external connection connect may be generated. A generation of the whisker can be reduced by performing annealing treatment etc. after formation of a plating film (for example, refer to Patent Reference 2).

[Patent Reference 1] Japanese Unexamined Patent Publication No. 2004-200249

[Patent Reference 2] Japanese Unexamined Patent Publication No. 2002-368175

SUMMARY OF THE INVENTION

However, by the method of depending on the above-mentioned conventional technology, the generation of the whisker was not fully able to be reduced.

The present invention was made in order to solve the above-mentioned problem, and the present invention aims at suppressing a generation of a whisker leading to a short circuit defect of a lead for external connection in a manufacturing method of a semiconductor device of a resin molded type.

A manufacturing method of a semiconductor device concerning the present invention comprises the steps of: forming a plating film including Sn over a surface of a lead for external connection; and performing heat treatment which melts the plating film; wherein in the step of performing heat treatment, a temperature more than or equal to a melting-point of the plating film is held for 20 seconds or more. The other features of the present invention are explained in detail below.

According to the present invention, in a manufacturing method of a semiconductor device of a resin molded type, a generation of a whisker leading to a short circuit defect of a lead for external connection can be suppressed low.

DETAILED DESCRIPTION OF THE PREFERRED EMBODIMENTS

There will now be described embodiments of this invention with reference to accompanying drawings. In each drawing, the same numeral is given to the same or a corresponding portion, and the explanation is simplified or omitted.

Embodiment 1

Figure 1:
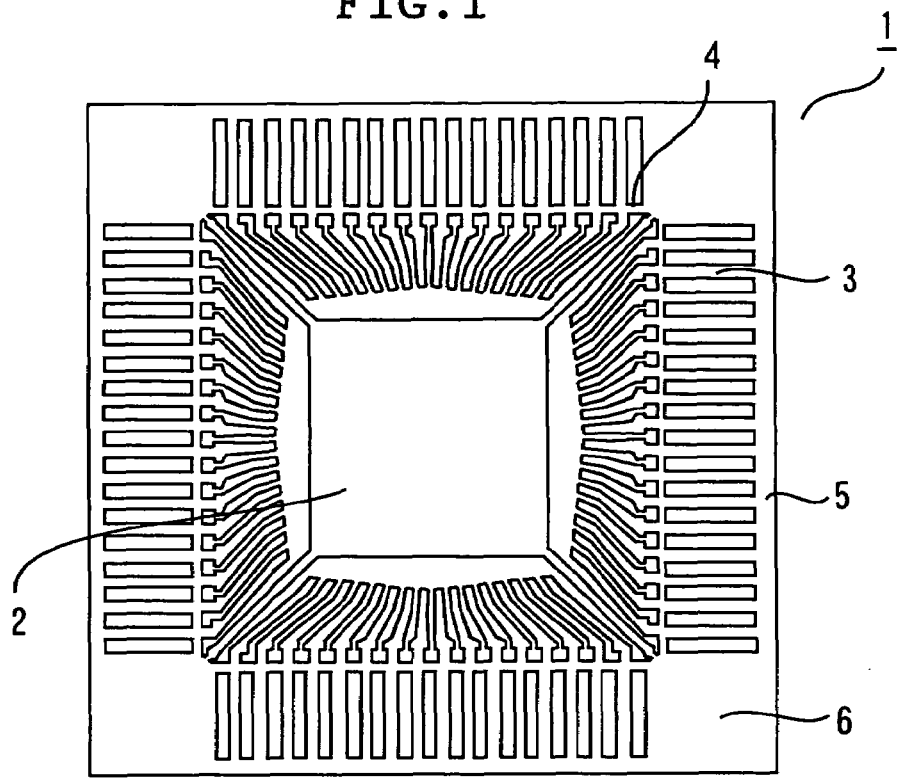
FIG. 1 is a drawing showing the manufacturing method of the semiconductor device concerning Embodiment 1 and 2.

A manufacturing method of a semiconductor device concerning the embodiment is explained. First, although not illustrated, elements, such as a transistor, are formed on the main surface of a wafer. Next, dicing of the wafer is made and the wafer is cut into every semiconductor chip. FIG. 1 is a plan view of lead frame 1 for mounting the above-mentioned semiconductor chip and forming a semiconductor package. Lead frame 1 includes Fe (iron) and Ni (nickel), and is formed using an alloy (42Alloy) with which Ni was contained 42% (% of the weight). (Usually, although, as for the lead frame, a plurality of lead frames continue in a row in the shape of an array, only one lead frame is shown here.) Die pad 2 is formed in the central part of lead frame 1. A plurality of leads 3 are formed along the periphery of lead frame 1. Tie bar 4 is formed between die pad 2 and lead 3. Frame 5 is formed so that lead 3 may be surrounded, and lead 3 is supported.

Suspension lead 6 is formed in the four corners of lead frame 1, and die pad 2 and frame 5 are connected.

Figure 2:
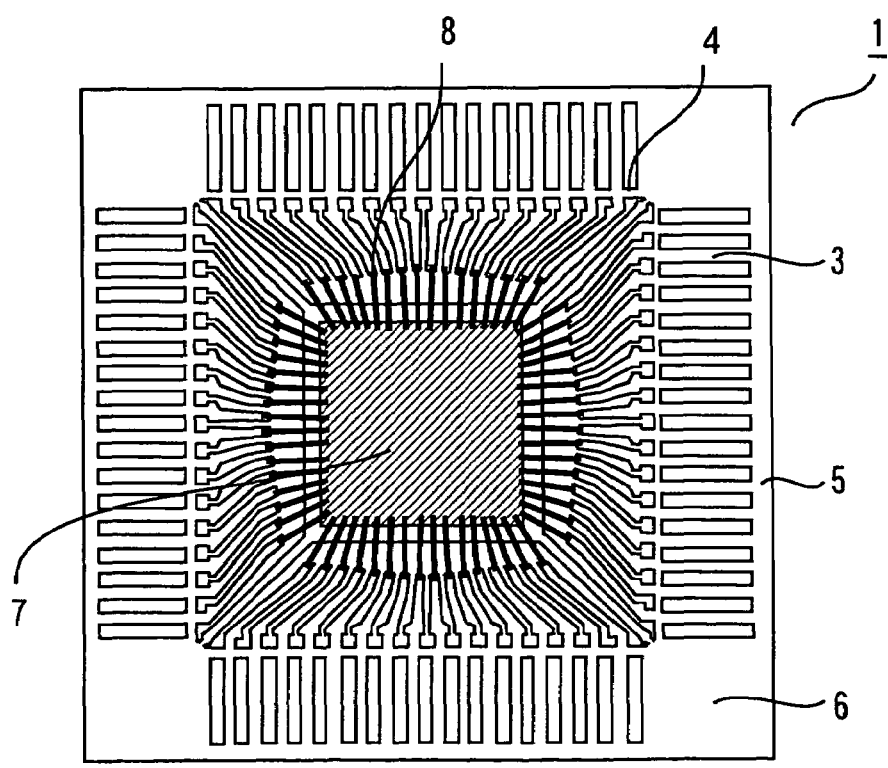
FIG. 2 is a drawing showing the manufacturing method of the semiconductor device concerning Embodiment 1 and 2.
Figure 3:
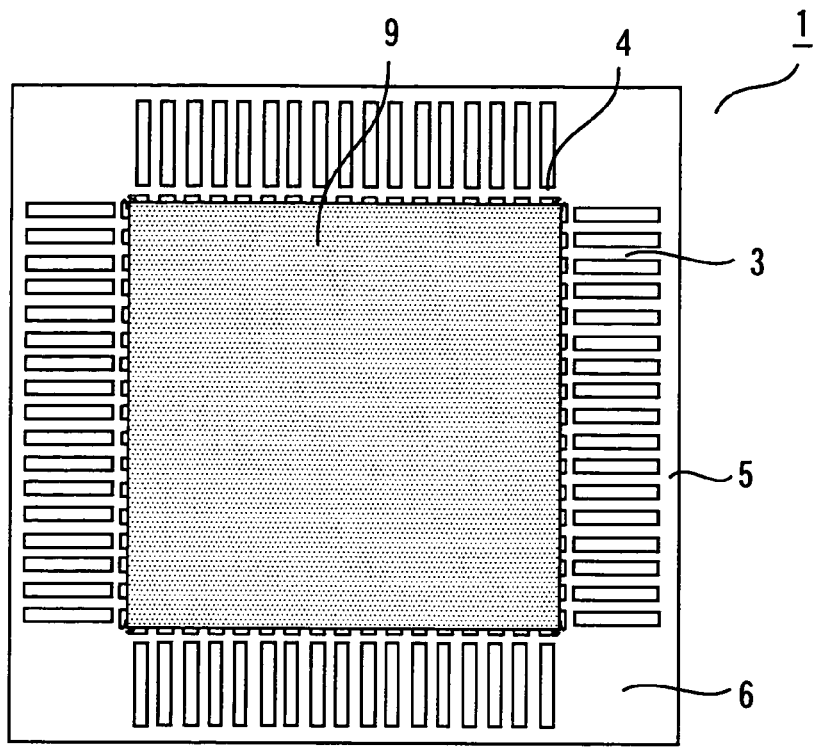
FIG. 3 is a drawing showing the manufacturing method of the semiconductor device concerning Embodiment 1 and 2.

Next, as shown in FIG. 2, semiconductor chip 7 is mounted on die pad 2. Next, wire bonding of semiconductor chip 7 and lead 3 is made with metal wire 8. Next, the semiconductor chip 7 whole is covered so that a sealing metal mold (not shown) holds tie bar 4 from the front surface and the back surface of lead frame 1. Next, resin is injected into the inside of the sealing metal mold. At this time, the injected resin is dammed up by tie bar 4 and the injected resin does not flow into the outside of the sealing metal mold. Next, the sealing metal mold is removed. As a result, as shown in FIG. 3, sealing resin 9 covering semiconductor chip 7 (not shown) is formed.

Figure 4:
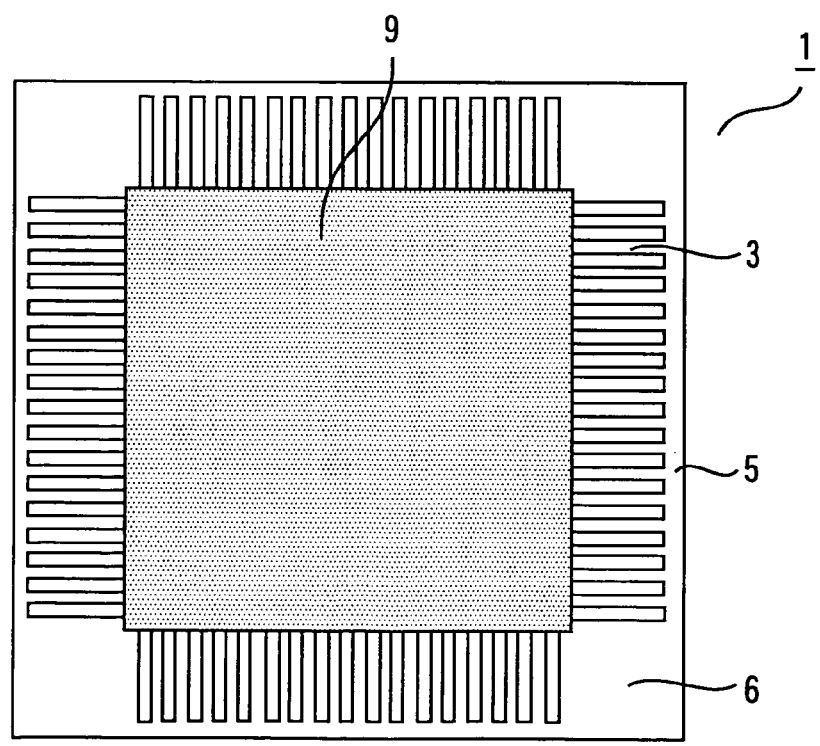
FIG. 4 is a drawing showing the manufacturing method of the semiconductor device concerning Embodiment 1 and 2.

Next, tie bar 4 is punched and cut. As a result, as shown in FIG. 4, the portion connected by tie bar 4 of adjoining lead 3 is electrically separated. Next, suspension lead 6 is punched and cut. As a result, as shown in FIG. 5, lead 3a for external connection is formed.

Figure 5:
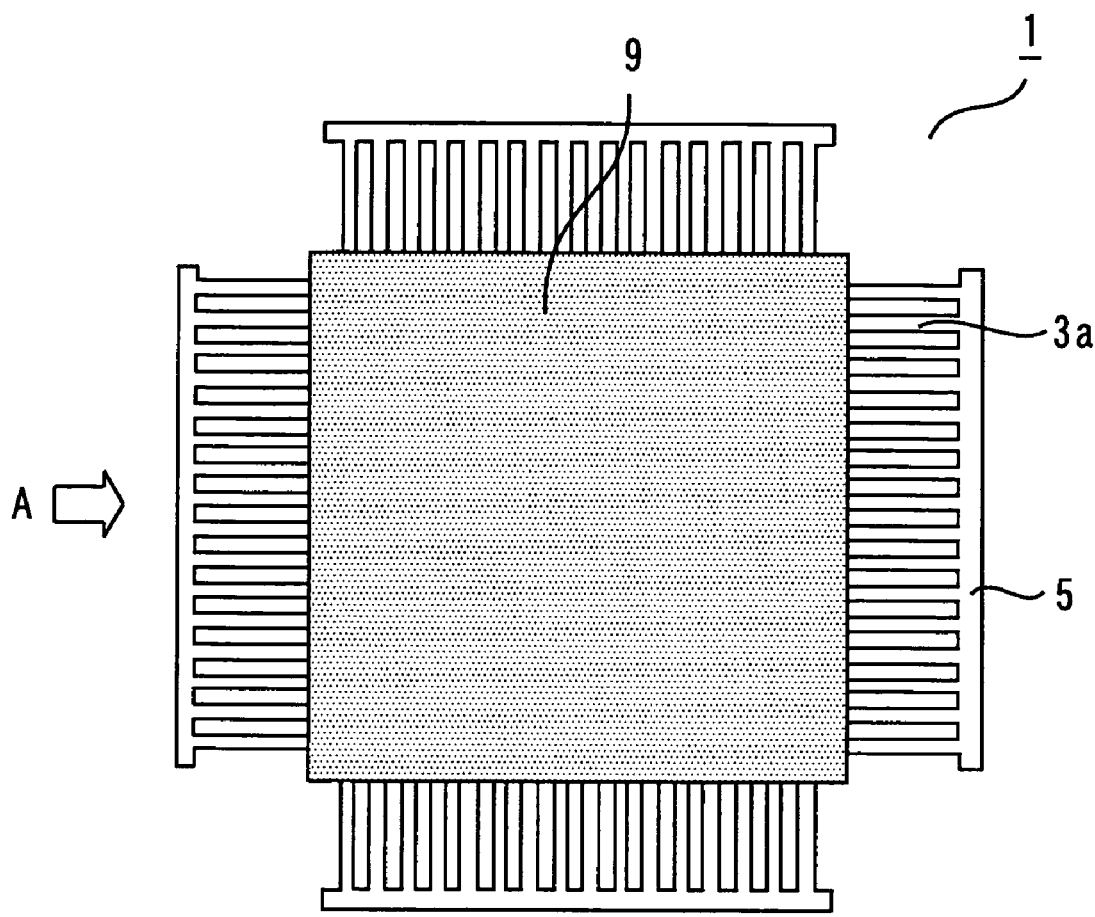
FIG. 5 is a drawing showing the manufacturing method of the semiconductor device concerning Embodiment 1 and 2.
Figure 6:
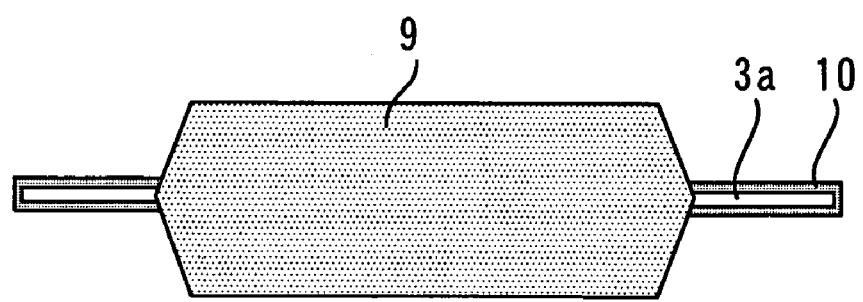
FIG. 6 is a drawing showing the manufacturing method of the semiconductor device concerning Embodiment 1 and 2.
Figure 7:
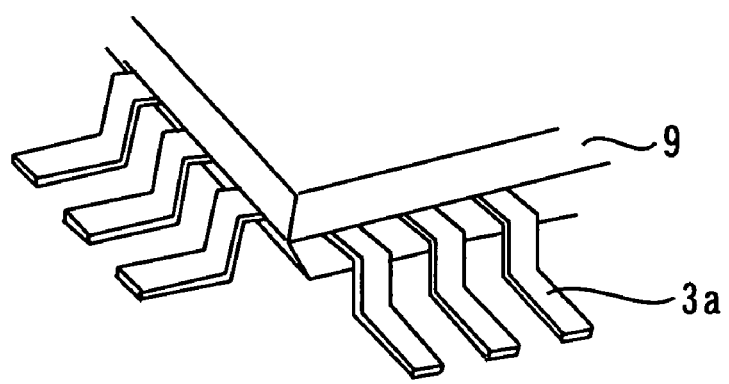
FIG. 7 is a drawing showing the manufacturing method of the semiconductor device concerning Embodiment 1 and 2.

Next, plating film 10 is formed on the surface of lead 3a for external connection shown in FIG. 5 using an electrolysis electroplating method. This film is an alloy which added Cu (copper) to Sn (tin). At this time, the sectional view of lead frame 1 becomes like shown in FIG. 6. The step which forms plating film 10 can also be performed before a tie bar 4 punching step and a suspension lead 6 punching step. Next, bending processing of lead 3a for external connection is done, and the tip part is cut. As a result, as shown in FIG. 7 (perspective view), lead 3a for external connection is formed.

Figure 8:
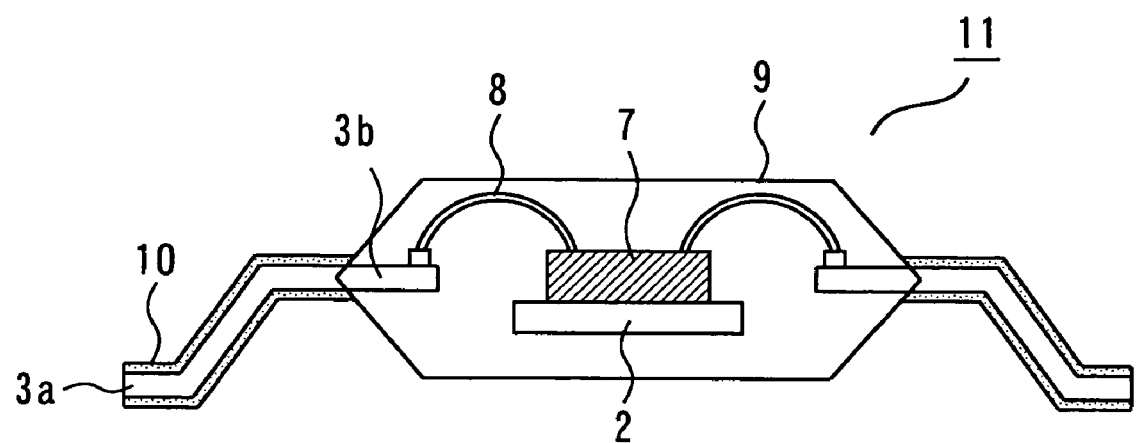
FIG. 8 is a drawing showing the manufacturing method of the semiconductor device concerning Embodiment 1 and 2.

By the manufacturing method explained above, plating film 10 is formed on the surface of lead 3a for external connection, and lead 3a for external connection is formed. As a result, as shown in FIG. 8 (sectional view), semiconductor package 11 individually separated is formed. Semiconductor chip 7 is being fixed on die pad 2 of semiconductor package 11. Semiconductor chip 7 is connected with lead 3b for internal connection via metal wire 8. As for die pad 2, semiconductor chip 7, metal wire 8, and lead 3b for internal connection, the whole is covered with sealing resin 9. Lead 3b for internal connection is connected to lead 3a for external connection. Bending forming of lead 3a for external connection is done, and plating film 10 is formed on the surface.

Next, in order to suppress that a whisker occurs on the surface of plating film 10, the heat treatment process which melts plating film 10 is performed. Heat-treat furnace 12 shown in FIG. 9 performs this heat treatment, for example. Semiconductor package 11 is carried in from the IN side of heat-treat furnace 12. After semiconductor package 11 is heat-treated, it is carried out outside from the OUT side of heat-treat furnace 12. Heaters 13a and 13b are formed in the inside of heat-treat furnace 12. These can heat the inside of heat-treat furnace 12 with the hot blast and far-infrared rays. Wire mesh conveyor belt 14 for transportation is formed in heat-treat furnace 12. Heat-resistant tray 15 is formed on wire mesh conveyor belt 14. On tray 15, semiconductor package 11 (refer to FIG. 8) is laid. At this time, semiconductor package 11 is laid in the condition that mounting surface 11a faces down, i.e., the condition that the surface connected to an external equipment (mounting substrate etc.) of lead 3a for external connection faces down. Thus, by heat treatment, it can be prevented that the thickness of the portion in contact with a mounting substrate of plating film 10 becomes thin after plating film 10 (refer to FIG. 8) melts. Hereby, a soldering failure can be prevented when soldering semiconductor package 11 to a mounting substrate.

It is preferred to perform the above-mentioned heat treatment in an inert atmosphere of nitrogen etc. Thus, when melting plating film 10 by heat treatment, it can be prevented that the surface oxidizes. Hereby, plating film 10 can be melted effectively.

Figure 10:
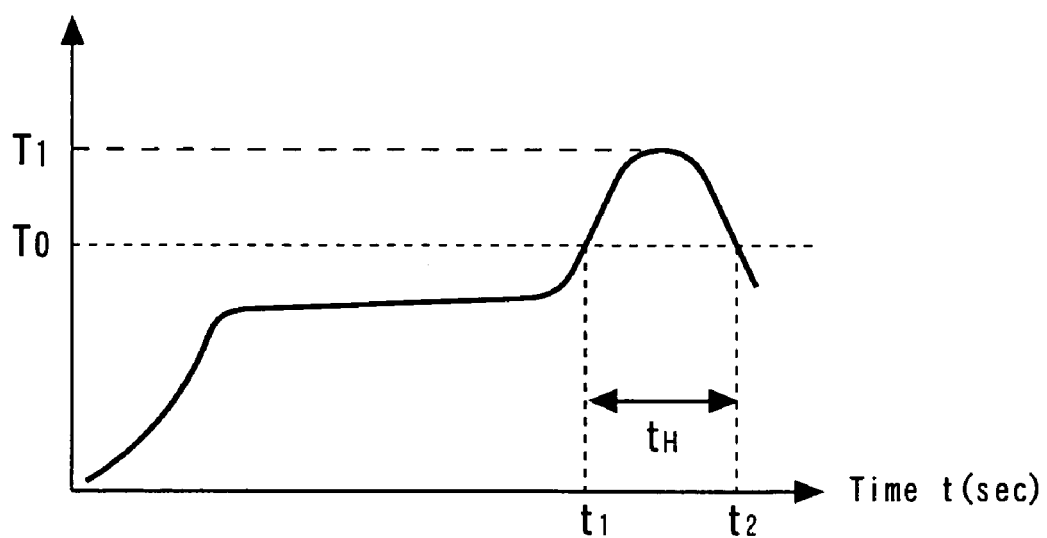
FIG. 10 is a drawing showing the manufacturing method of the semiconductor device concerning Embodiment 1 and 2.

The change with the lapse of time of the heat treatment temperature of the above-mentioned heat treatment process is shown in FIG. 10. The axis of abscissa of this graph shows time t after semiconductor package 11 was carried in to the inside of heat-treat furnace 12. The axis of ordinate shows heat treatment temperature (temperature of plating film 10) T in each time t. When semiconductor package 11 is carried in to the inside of heat-treat furnace 12, temperature T will reach melting-point temperature $T_0$ (about 227° C.) of plating film 10 at $t_1$. Further, the temperature up of the temperature T is made to the maximum temperature $T_1$ (about 245° C.). Then, temperature T falls gradually and becomes melting-point temperature $T_0$ at $t_2$. Furthermore, temperature T becomes lower than $T_0$ after time t2 progress. Then, semiconductor package 11 is carried out to the outside of heat-treat furnace 12. In the above-mentioned heat treatment process, temperature T is held more than melting-point temperature $T_0$ of plating film 10 until it results in $t_2$ from $t_1$. In the above-mentioned heat treatment process, $t_2-t_1$ (hereinafter referred to as "more-than-melting-point-temperature-holding-time $t_H$") was made into 20 seconds or more.

Figure 11:
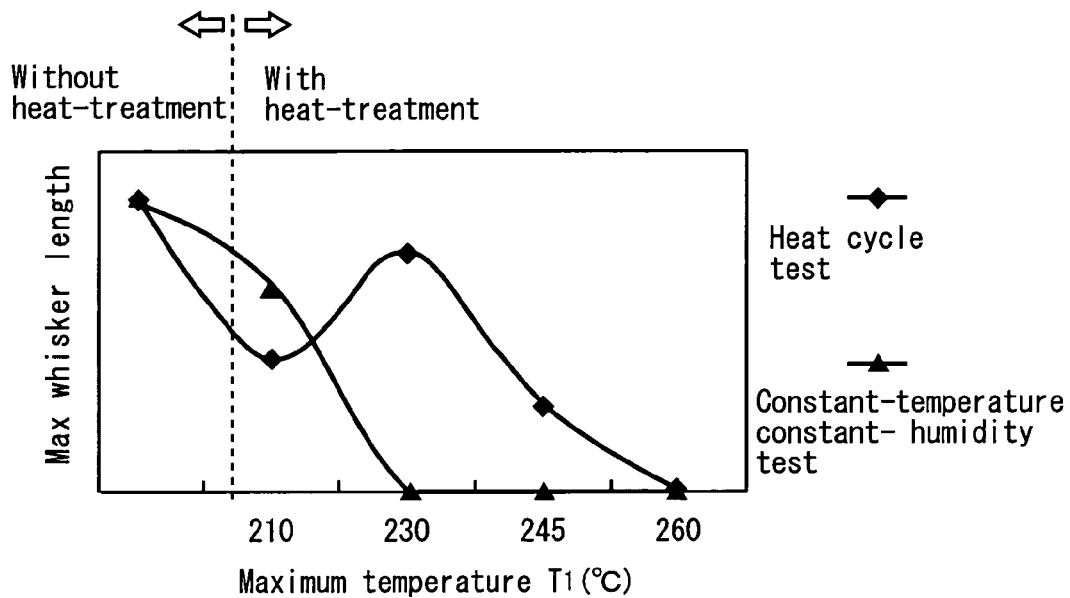
FIG. 11 is a drawing showing heat-treatment-temperature maximum T1 dependence of Max whisker length.

Next, the result of having evaluated the maximum length (henceforth "Max whisker length") of the whisker generated on the surface of plating film 10 changing the maximum temperature $T_1$ of the above-mentioned heat treatment is shown in FIG. 11. About a sample (reference) without heat treatment, and the sample of 210° C. in the maximum temperature $T_1$, more-than-melting-point-temperature-holding-time $t_H$ is zero. More than melting-point temperature holding time $t_H$ of the sample of 230° C. in the maximum temperature $T_1$ is less than 20 seconds. More than melting-point temperature holding time $t_H$ of the samples of 245° C. and 260° C. in the maximum temperature $T_1$ is all 20 seconds or more. About these samples, Max whisker length was evaluated after the heat cycle test and the constant-temperature constant-humidity test. As shown in FIG. 11, when the maximum temperature $T_1$ of heat treatment is made to more than or equal to 245° C., after the heat cycle test, Max whisker length is suppressed to ⅓ or less as compared with the reference. After the constant-temperature constant-humidity test, when the maximum temperature $T_1$ of heat treatment is made to more than or equal to 230° C., Max whisker length is mostly suppressed to zero. Max whisker length can be effectively reduced by making the maximum temperature $T_1$ to more than or equal to the melting-point temperature (about 227° C.) of plating film 10, and making more-than-melting-point-temperature-holding-time $t_H$ into 20 seconds or more in heat treatment mentioned above, from these things.

As for the maximum temperature $T_1$ shown in FIG. 10, in heat treatment mentioned above, it is preferred that the maximum temperature $T_1$ is less than the heat-resistant guarantee temperature for every product. This is because a crack may occur in semiconductor package 11, when heat treatment is performed at the temperature higher than the heat-resistant guarantee temperature for every product. Therefore, the crack generation of semiconductor package 11 can be effectively suppressed by making the above-mentioned maximum temperature $T_1$ below the heat-resistant guarantee temperature for every product. Although not restricted to being below the heat-resistant guarantee temperature for every product about the maximum temperature $T_1$, the crack generation of semiconductor package 11 can be effectively suppressed by making the maximum temperature $T_1$ below the heat-resistant guarantee temperature for every product.

Figure 9:
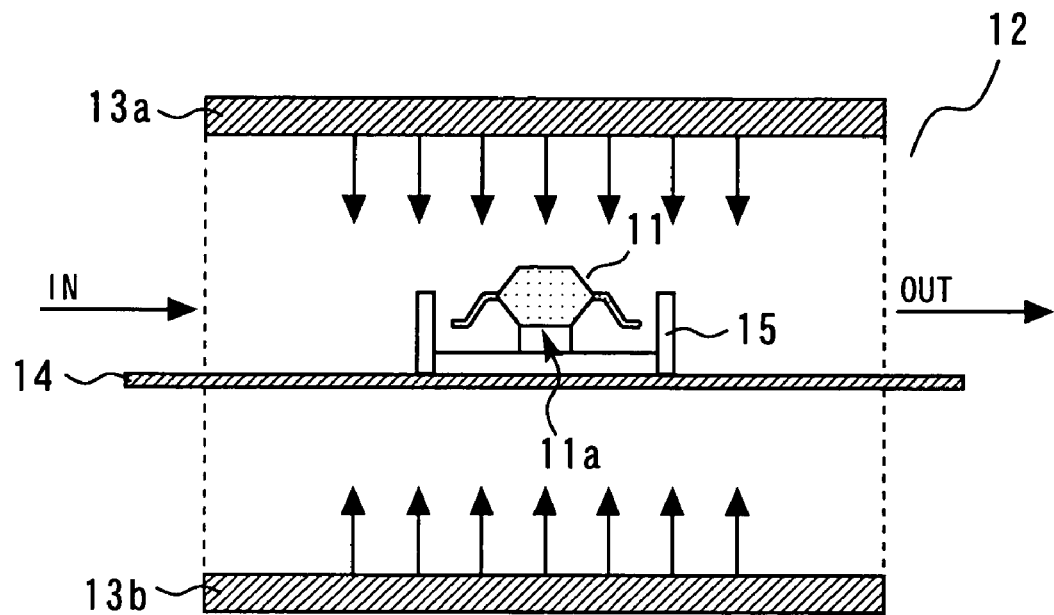
FIG. 9 is a drawing showing the manufacturing method of the semiconductor device concerning Embodiment 1 and 2.
Figure 12:
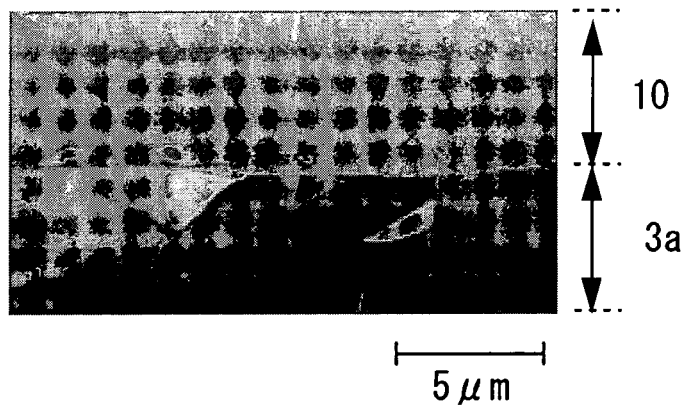
FIG. 12 is a cross-section SEM image of the lead for external connection.
Figure 13:
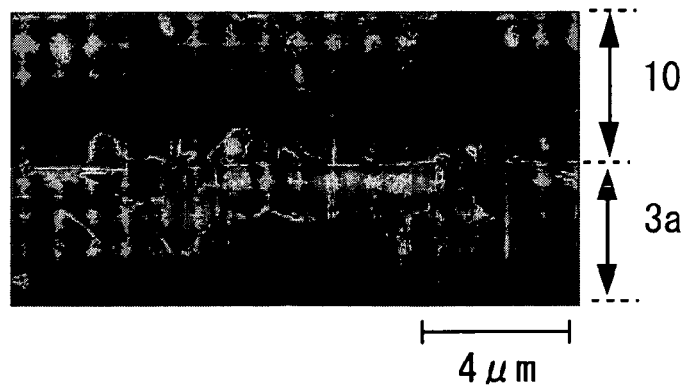
FIG. 13 is a cross-section SEM image of the lead for external connection.

The cross-section SEM image of plating film 10 after performing the heat treatment (the maximum temperature $T_1$ is 245° C., and more-than-melting-point-temperature-holding-time $t_H$ is 20 seconds or more) shown in FIG. 9 and FIG. 10 is shown in FIG. 12. The cross-section SEM image of plating film 10 which is not heat-treated is shown in FIG. 13. As shown in FIG. 12, a grain boundary does not exist in plating film 10 after performing the above-mentioned heat treatment. On the other hand, as shown in FIG. 13, a grain boundary exists in plating 10 with low peak temperature. From these results, it is thought that the grain boundary of plating film 10 disappeared by the above-mentioned heat treatment.

It is preferred to maintain the molten state until an oxide film formed on a surface of plating film 10 is destroyed in the above-mentioned heat treatment. This is considered to be based on the following reasons. Before heat-treating plating film 10, a thin oxide film is formed on the surface. For this reason, even if the maximum temperature $T_1$ of FIG. 10 is more than the melting point of plating film 10, when more-than-melting-point-temperature-holding-time $t_H$ is less than 20 seconds, the above-mentioned oxide film may not be destroyed. In this case, since plating film 10 does not fully flow, a grain boundary structure formed at the time of plating film 10 film formation is not destroyed sufficiently, and the ununiformity of the tissue of plating film 10 is not fully canceled. So, the grain boundary structure formed at the time of film formation of plating film 10 may remain partially after a heat treatment. However, when maintaining the molten state until the above-mentioned oxide film is destroyed, making more-than-melting-point-temperature-holding-time $t_H$ into 20 seconds or more, plating film 10 flows good and the ununiformity of the crystalline structure is fully canceled. Hereby, as shown in FIG. 12, a grain boundary of plating film 10 can be vanished.

When a grain boundary structure formed at the time of plating film formation remains in plating film 10, it is easy to generate a whisker on plating film 10 with the internal stress along this. On the other hand, as shown in FIG. 12, the grain boundary structure of plating film 10 has disappeared after the above-mentioned heat treatment. Since the internal stress along the grain boundary does not exist by this, it can be reduced effectively that a whisker occurs on plating film 10.

That is, in the above-mentioned heat treatment, more-than-melting-point-temperature-holding-time $t_H$ was made into 20 seconds or more, and the molten state was maintained until the oxide film formed in the surface of plating film 10 was destroyed. Hereby, as shown in FIG. 12, plating film 10 without a grain boundary structure can be formed. Therefore, it can be suppressed low that a whisker occurs on plating film 10.

After melting plating film 10, thickness variation becomes large compared with before melting. In the embodiment, lead 3a for external connection is formed (refer to FIG. 7) after the step which forms plating film 10 (refer to FIG. 6), and it is made to heat-treat plating film 10 (refer to FIG. 9 and FIG. 10) after the lead forming step. That is, lead 3a for external connection can be formed in the condition with more uniform thickness of plating film 10. Hereby, generation of formation failure of the lead for external connection can be prevented.

Figure 14:
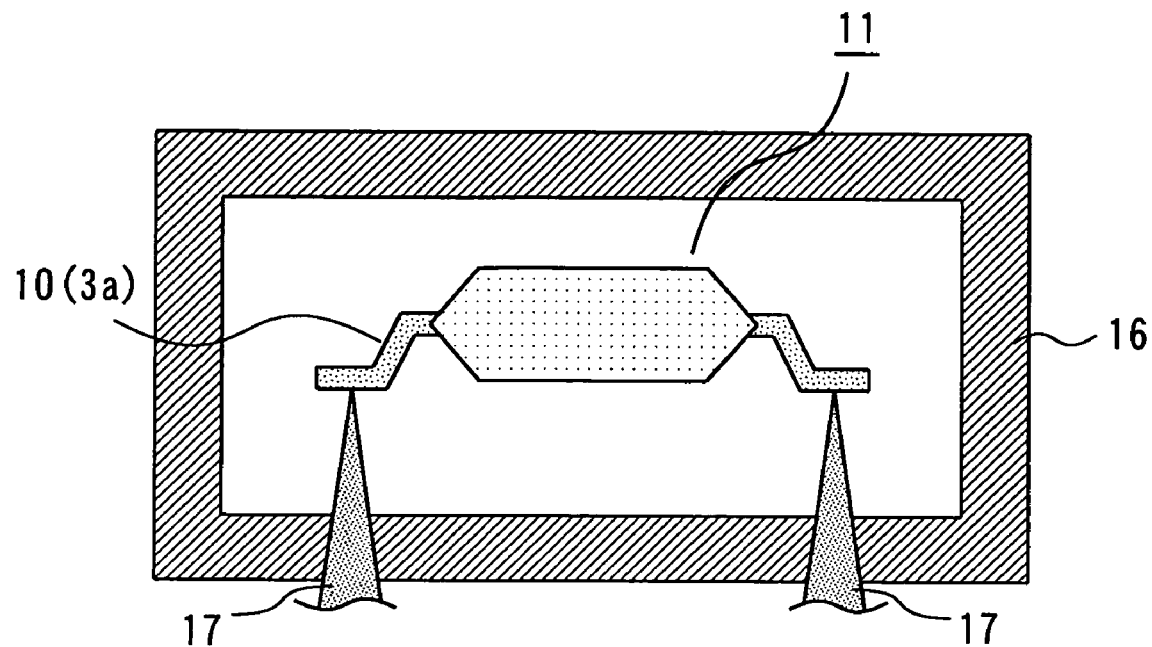
FIG. 14 is a drawing showing the electrical measurement test method of the semiconductor package.

Next, an electrical property test of the semiconductor package is done. This is performed by a tester. For example, as shown in FIG. 14, semiconductor package 11 is set to a tester's socket 16. And contact pin (contact terminal) 17 is contacted on plating film 10 (lead 3a for external connection), and the electrical property test is done.

Figure 15:
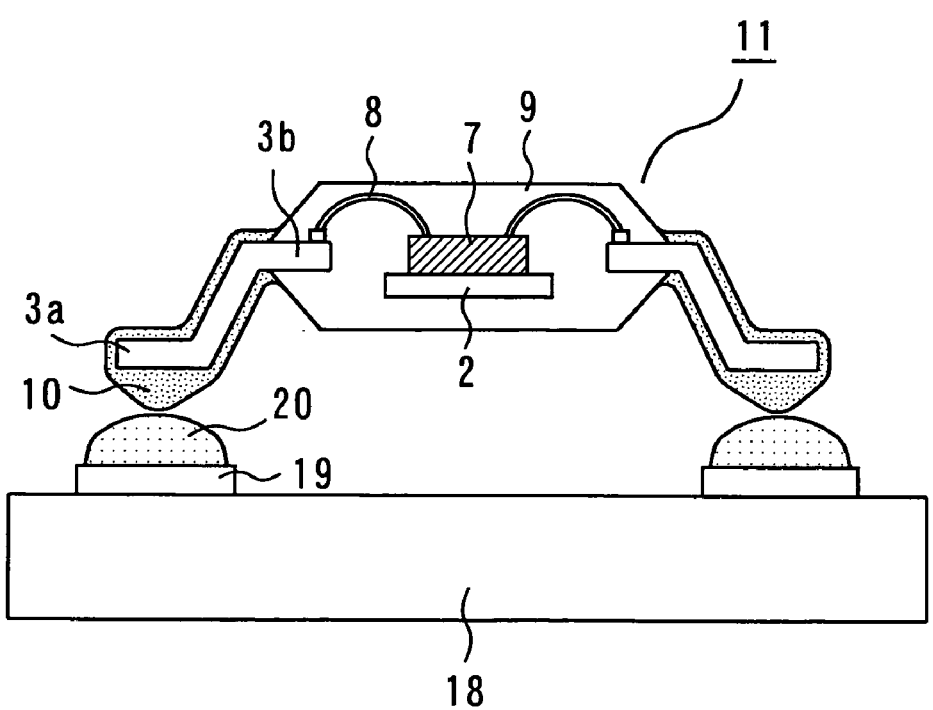
FIG. 15 is a drawing showing the manufacturing method of the semiconductor device concerning Embodiment 1 and 2.

Next, a semiconductor package judged to be an excellent article as a result of the above-mentioned electrical property test is soldered on a mounting substrate. For example, mounting substrate 18 shown in FIG. 15 is prepared. Next, melted solder 20 is made to adhere on connection terminal 19 of mounting substrate 18. And the tip part (plating film 10) of lead 3a for external connection is contacted to this solder. Thus, lead 3a for external connection is soldered to mounting substrate 18. As mentioned above, the heat treatment process shown in FIG. 9 is made to be performed in the condition that mounting surface 11a faces downward (condition that the surface connected to mounting substrate 18 of lead 3a for external connection faces downward). For this reason, the portion in contact with solder 20 of plating film 10 is a little thick as compared with another portions of lead 3a for external connection. Hereby, a soldering failure of lead 3a for external connection and mounting substrate 18 can be prevented.

In the embodiment, the electrical property test shown in FIG. 14 is done after the heat treatment process shown in FIG. 9 and FIG. 10. Hereby, when a defect occurs with the heat load of the above-mentioned heat treatment process, this defect can be screened by the above-mentioned electrical property test.

Embodiment 2

A manufacturing method of a semiconductor device concerning the embodiment is explained. The embodiment explains focusing on a different point from Embodiment 1. First, from the step which forms elements, such as a transistor, on the main surface of a wafer to the step which forms lead 3a for external connection (refer to FIG. 7) is performed like Embodiment 1.

Next, as shown in FIG. 14, semiconductor package 11 is set to a tester's socket 16. And contact pin 17 is contacted on plating film 10 (lead 3a for external connection), and an electrical property test is done. Then, a heat treatment process of plating film 10 is performed. The method of the heat treatment is performed like the method (refer to FIG. 9, 10) shown in Embodiment 1. Then, the soldering step shown in FIG. 15 is performed.

In Embodiment 1, the electrical property test shown in FIG. 14 is performed after the heat treatment process shown in FIG. 9 and FIG. 10. On the other hand, in Embodiment 2, the above-mentioned electrical property test is done before the above-mentioned heat treatment process (refer to FIG. 9, 10). Since it is the same as that of Embodiment 1 about other structure, explanation is omitted.

Since to be before the above-mentioned heat treatment process (refer to FIG. 9, 10) is to be before plating film 10 is melted, the thickness of plating film 10 is more uniform as compared with that of after the heat treatment process, and its dimensional accuracy of the lead is high. Hereby, in an electrical property test (refer to FIG. 14), the contact failure of plating film 10 (lead 3a for external connection) and contact pin 17 can be reduced. Therefore, the incorrect test of the above-mentioned electrical property test can be prevented effectively.

What is claimed is:

1. A manufacturing method of a semiconductor device, comprising the steps of:
    forming a plating film including Sn over a surface of a lead for external connection; and
    performing heat treatment which melts the plating film without mounting the lead for external connection on a mounting substrate;

wherein in the step of performing heat treatment, a temperature more than or equal to a melting-point of the plating film is held for 20 seconds or more.

2. A manufacturing method of a semiconductor device according to claim 1, wherein a maximum temperature of the step of performing heat treatment is less than a heat-resistant guarantee temperature of the semiconductor device.

3. A manufacturing method of a semiconductor device according to claim 1, wherein the step of performing heat treatment is performed in a condition that a surface for connection to a mounting substrate of the lead for external connection is downward.

4. A manufacturing method of a semiconductor device according to claim 1, wherein the step of performing heat treatment is performed in an inert atmosphere.

5. A manufacturing method of a semiconductor device according to claim 1, wherein the lead for external connection is made of an alloy including Fe and Ni.

6. A manufacturing method of a semiconductor device according to claim 1, further comprising the steps of:

preparing a leadframe having a die pad, a plurality of leads and a tie bar connecting the plurality of leads, each lead being for external connection;

mounting a semiconductor chip on the die pad of the leadframe;

electrically connecting the semiconductor chip to the plurality of leads for external connection;

sealing the semiconductor chip with a resin; and cutting the tie bar after the step of sealing the semiconductor chip;

wherein the step of forming the plating film is performed after the step of cutting the tie bar.

7. A manufacturing method of a semiconductor device according to claim 6, further comprising the step of bending the lead for external connection after the step of forming the plating film and before the step of performing the heat treatment.

8. The manufacturing method according to claim 1, wherein the plating film is a lead-free plating film.

9. The manufacturing method according to claim 1, wherein the heat treatment is performed without removing the plating film from any part of the lead for external connection.

10. A manufacturing method of a semiconductor device, comprising the steps of:

forming a plating film including Sn over a surface of a lead for external connection; and performing heat treatment which melts the plating film without mounting the lead for external connection on a mounting substrate;

wherein in the step of performing heat treatment, a molten state is maintained for 20 seconds or more until an oxide film formed over a surface of the plating film is destroyed.

11. The manufacturing method according to claim 10, wherein the plating film is a lead-free plating film.

12. The manufacturing method according to claim 10, wherein the heat treatment is performed without removing the plating film from any part of the lead for external connection.

13. A manufacturing method of a semiconductor device, comprising the steps of:

forming a plating film including Sn over a surface of a lead for external connection; and performing heat treatment which melts the plating film without mounting the lead for external connection on a mounting substrate, wherein the performing heat treatment includes applying a temperature more than or equal to a melting-point of the plating film for 20 seconds or more, and after the step of forming the plating film, and before the step of performing heat treatment, a forming step of the lead is performed.

14. A manufacturing method of a semiconductor device according to claim 13, wherein after the step of performing heat treatment, an electrical property test is done by contacting a terminal over the plating film.

15. A manufacturing method of a semiconductor device according to claim 13, wherein after the forming step of the lead, and before the step of performing heat treatment, an electrical property test is done by contacting a terminal over the plating film.

16. The manufacturing method according to claim 13, wherein the plating film is a lead-free plating film.

17. The manufacturing method according to claim 13, wherein the heat treatment is performed without removing the plating film from any part of the lead for external connection.

* * * * *